US012628628B2

(12) United States Patent
Briggs et al.

(10) Patent No.: US 12,628,628 B2
(45) Date of Patent: May 12, 2026

(54) STRUCTURE AND METHOD TO IMPROVE FAV RIE PROCESS MARGIN AND ELECTROMIGRATION

(71) Applicant: Adeia Semiconductor Solutions LLC, San Jose, CA (US)

(72) Inventors: Benjamin David Briggs, Waterford, NY (US); Joe Lee, Albany, NY (US); Theodorus Eduardus Standaert, Clifton Park, NY (US)

(73) Assignee: Adeia Semiconductor Solutions LLC, San Jose, CA (US)

( * ) Notice: Subject to any disclaimer, the term of this patent is extended or adjusted under 35 U.S.C. 154(b) by 184 days.

(21) Appl. No.: 18/677,474

(22) Filed: May 29, 2024

(65) Prior Publication Data

US 2025/0132199 A1 Apr. 24, 2025

Related U.S. Application Data

(63) Continuation of application No. 18/205,178, filed on Jun. 2, 2023, now Pat. No. 12,033,892, which is a
(Continued)

(51) Int. Cl.
*H01L 21/768* (2006.01)
*H01L 23/522* (2006.01)
(Continued)

(52) U.S. Cl.
CPC .. *H01L 21/76831* (2013.01); *H01L 21/76816* (2013.01); *H01L 21/76834* (2013.01); *H01L 21/76849* (2013.01); *H01L 21/76877*

(2013.01); *H01L 21/76897* (2013.01); *H01L 23/5226* (2013.01); *H01L 23/528* (2013.01); *H01L 23/53228* (2013.01); *H01L 23/53238* (2013.01); *H01L 21/76883* (2013.01)

(58) Field of Classification Search
CPC ......... H01L 21/76831; H01L 21/76816; H01L 21/76834; H01L 21/76849; H01L 21/76877; H01L 21/76897; H01L 23/5226; H01L 23/528; H01L 23/53228; H01L 23/53238; H01L 21/76883
See application file for complete search history.

(56) References Cited

U.S. PATENT DOCUMENTS 7,488,679 B2 2/2009 Standaert et al.
8,329,572 B2 12/2012 Isono
(Continued)

OTHER PUBLICATIONS

Anonymous, "A Structure and Method for bi-Directionally Self-Aligned Vias (bSAV)," IP.Com No. IPCOM000201787D, Nov. 23, 2010, 4 pages.
(Continued)

*Primary Examiner* — Robert G Bachner
(74) *Attorney, Agent, or Firm* — HG LAW LLP

(57) ABSTRACT

A method of forming fully aligned vias in a semiconductor device, the method including forming a first level interconnect line embedded in a first interlevel dielectric (ILD), selectively depositing a dielectric on the first interlevel dielectric, laterally etching the selectively deposited dielectric, depositing a dielectric cap layer and a second level interlevel dielectric on top of the first interlevel dielectric, and forming a via opening.

20 Claims, 22 Drawing Sheets

Related U.S. Application Data continuation of application No. 17/212,267, filed on Mar. 25, 2021, now Pat. No. 11,710,658, which is a continuation of application No. 15/852,151, filed on Dec. 22, 2017, now Pat. No. 10,985,056, which is a continuation of application No. 15/335,122, filed on Oct. 26, 2016, now Pat. No. 9,953,865.

(51) Int. Cl.

| | | |
|---|---|---|
| *H01L 23/528* | (2006.01) | |
| *H01L 23/532* | (2006.01) | |

(56) References Cited

U.S. PATENT DOCUMENTS

| | | | |
|---|---|---|---|
| 8,614,144 | B2 | 12/2013 | Kato |
| 8,772,938 | B2 | 7/2014 | Boyanov et al. |
| 8,803,321 | B2 | 8/2014 | Holmes et al. |
| 8,916,337 | B2 | 12/2014 | Arnold et al. |
| 8,992,792 | B2 | 3/2015 | Chang et al. |
| 9,059,257 | B2 | 6/2015 | Li et al. |
| 9,219,007 | B2 | 12/2015 | Chen et al. |
| 9,236,342 | B2 | 1/2016 | Bristol et al. |
| 9,324,650 | B2 | 4/2016 | Edelstein et al. |
| 9,362,165 | B1 | 6/2016 | Bouche et al. |
| 9,627,318 | B2 | 4/2017 | Lin et al. |
| 9,698,100 | B2 | 7/2017 | Lu et al. |
| 9,793,159 | B2 | 10/2017 | Wallace et al. |
| 9,953,865 | B1 | 4/2018 | Briggs et al. |
| 10,957,584 | B2 | 3/2021 | Briggs et al. |
| 10,985,056 | B2 | 4/2021 | Briggs et al. |
| 11,710,658 | B2 | 7/2023 | Briggs et al. |
| 12,033,892 | B2 | 7/2024 | Briggs et al. |
| 2008/0026568 | A1 | 1/2008 | Standaert et al. |
| 2009/0200683 | A1 | 8/2009 | Colburn et al. |
| 2011/0171824 | A1* | 7/2011 | Isono ................ H01L 21/76849 438/624 |
| 2013/0216776 | A1 | 8/2013 | Arnold et al. |
| 2013/0328208 | A1 | 12/2013 | Holmes et al. |
| 2014/0024220 | A1 | 1/2014 | Chang et al. |
| 2014/0151893 | A1 | 6/2014 | Boyanov et al. |
| 2014/0363969 | A1 | 12/2014 | Chen et al. |
| 2015/0091181 | A1 | 4/2015 | Li et al. |
| 2015/0171010 | A1 | 6/2015 | Bristol et al. |
| 2015/0364420 | A1 | 12/2015 | Lin et al. |
| 2016/0190009 | A1 | 6/2016 | Wallace et al. |
| 2017/0053863 | A1 | 2/2017 | Lu et al. |
| 2018/0114723 | A1 | 4/2018 | Briggs et al. |
| 2018/0122691 | A1 | 5/2018 | Briggs et al. |
| 2018/0122692 | A1 | 5/2018 | Briggs et al. |
| 2021/0210380 | A1 | 7/2021 | Briggs et al. |
| 2024/0145299 | A1 | 5/2024 | Briggs et al. |

OTHER PUBLICATIONS

Anonymous, "Bi-Directionally Self-Aligned Vias," IPCOM000231097D, Sep. 26, 2013, 6 pages.

Briggs et al., "Structure and Method for Selective Fully Aligned via (Fav)," IBM Disclosure YOR8-2015-1873, Oct. 8, 2015.

Nag et al., "Structure and Method for Self-Aligned Inverted via Interconnect," IBM Disclosure FIS8-2014-0395, Mar. 28, 2014.

U.S. Non-Final Office Action dated Jun. 30, 2017 in U.S. Appl. No. 15/335,122.

U.S. Notice of Allowance dated Nov. 27, 2017 in U.S. Appl. No. 15/335,122.

United States Office Action dated Apr. 17, 2019, in co-pending U.S. Appl. No. 15/852,151.

United States Office Action dated Jun. 13, 2019, in co-pending U.S. Appl. No. 15/852,151.

United States Office Action dated Mar. 19, 2019, in co-pending U.S. Appl. No. 15/852,176.

United States Office Action dated Mar. 6, 2019, in co-pending U.S. Appl. No. 15/852,176.

United States Office Action dated Oct. 1, 2019, in co-pending U.S. Appl. No. 15/852,176.

United States Office Action dated Sep. 19, 2019, in co-pending U.S. Appl. No. 15/852,151.

Yang et al., "Structure and Fabrication of the Same: Interconnect Structure," IBM Disclosure YOR8-2013-1864, Dec. 9, 2013.

\* cited by examiner

100

V1/M2
ILD

V0/M1
ILD    M1

V0/M1
ILD

M1

<u>300</u>

290

STRUCTURE AND METHOD TO IMPROVE FAV RIE PROCESS MARGIN AND ELECTROMIGRATION

CROSS-REFERENCE TO RELATED APPLICATION

The present application is a continuation of U.S. patent application Ser. No. 18/205,178, filed Jun. 2, 2023, which is a continuation of U.S. patent application Ser. No. 17/212, 267, filed Mar. 25, 2021, now U.S. Pat. No. 11,710,658, which is a continuation of U.S. patent application Ser. No. 15/852,151, filed on Dec. 22, 2017, now U.S. Pat. No. 10,985,056, which is a continuation of U.S. patent application Ser. No. 15/335,122, filed on Oct. 26, 2016, now U.S. Pat. No. 9,953,865, the entire contents of which are hereby incorporated by reference in their entireties.

BACKGROUND OF THE INVENTION

Field of the Invention

The present invention relates generally to a method, system, and apparatus for a semiconductor using fully aligned via (FAV) reactive ion etching (RIE), and more particularly relates to a method, system, and apparatus to improve FAV RIE process margin and Electromigration resistance.

Description of the Related Art

The fabrication of Very-Large Scale Integrated (VISI) requires an interconnect structure including metallic wiring that connects individual devices in a single semiconductor chip. With the chip being massively reduced in size over the years, the interconnect structure has also been reduced accordingly. The via levels are one of the most challenging to print. Additionally, there are overlay errors that result from misalignment during the lithography. The overlay errors may lead to reliability issues.

A failure for interconnects that may be dependent on overlay error of lithographic patterns, are electromigration (EM) and time-dependent dielectric breakdown (TDDB). Overlay errors in the related art result in reduced spacing between the via and the metal level below, and therefore increase the dielectric field. There is a need to provide a technique of reducing the spacing variation.

There is a need to providing a technique of forming a fully aligned via that is more efficient and avoids affecting yield and reliability issues such that there is an improvement in process margin and Electromigration resistance.

SUMMARY OF INVENTION

In view of the foregoing and other problems, disadvantages, and drawbacks of the aforementioned background art, an exemplary aspect of the present invention provides a system, apparatus, and method of providing a method, system, and apparatus to improve FAV RIF process margin and Electromigration resistance.

One aspect of the present invention provides a method of forming fully aligned vias in a semiconductor device. The method includes forming an Mx level interconnect line embedded in an Mx interlevel dielectric (ILD). The Mx level interconnect line is recessed below the Mx interlevel dielectric or a dielectric is selectively deposited on the Mx interlevel dielectric. The method also includes laterally etching the exposed upper portion of the Mx interlevel dielectric bounding the recess or laterally etching the selectively deposited dielectric. The method further includes depositing a dielectric cap layer and an Mx+1 level interlevel dielectric on top of the Mx interlevel dielectric and forming a via opening.

Another aspect of the present invention provides a semiconductor device including an Mx interlevel dielectric (ILD), an Mx level interconnect line embedded in the Mx interlevel dielectric, and an Mx+1 level ILD formed on the Mx interlevel dielectric and the Mx level interconnect line. The Mx interconnect line is recessed below the Mx interlevel dielectric. The Mx interlevel dielectric includes an exposed upper portion bounding the recess, a dielectric cap layer deposited on the Mx interlevel dielectric, and the Mx level interconnect line.

Yet another aspect of the present invention provides a semiconductor device including an Mx interlevel dielectric (ILD), an Mx level interconnect line embedded in the Mx interlevel dielectric, a dielectric layer selectively formed on the Mx interlevel dielectric and laterally etched to bound a via, a dielectric cap layer, and an Mx+1 level ILD. The dielectric cap layer is deposited on the Mx interlevel dielectric, the via, the Mx level interconnect line, and the dielectric layer. The Mx+1 level ILD is formed on the Mx interlevel dielectric, the dielectric layer, and the Mx level interconnect line.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF DRAWINGS

The exemplary aspects of the invention will be better understood from the following detailed description of the exemplary embodiments of the invention with reference to the drawings.

FIG. 4A illustrates a step performed where the corner rounding shown in FIG. 1D does not take place.

US 12,628,628 B2

3

Figure 6A:
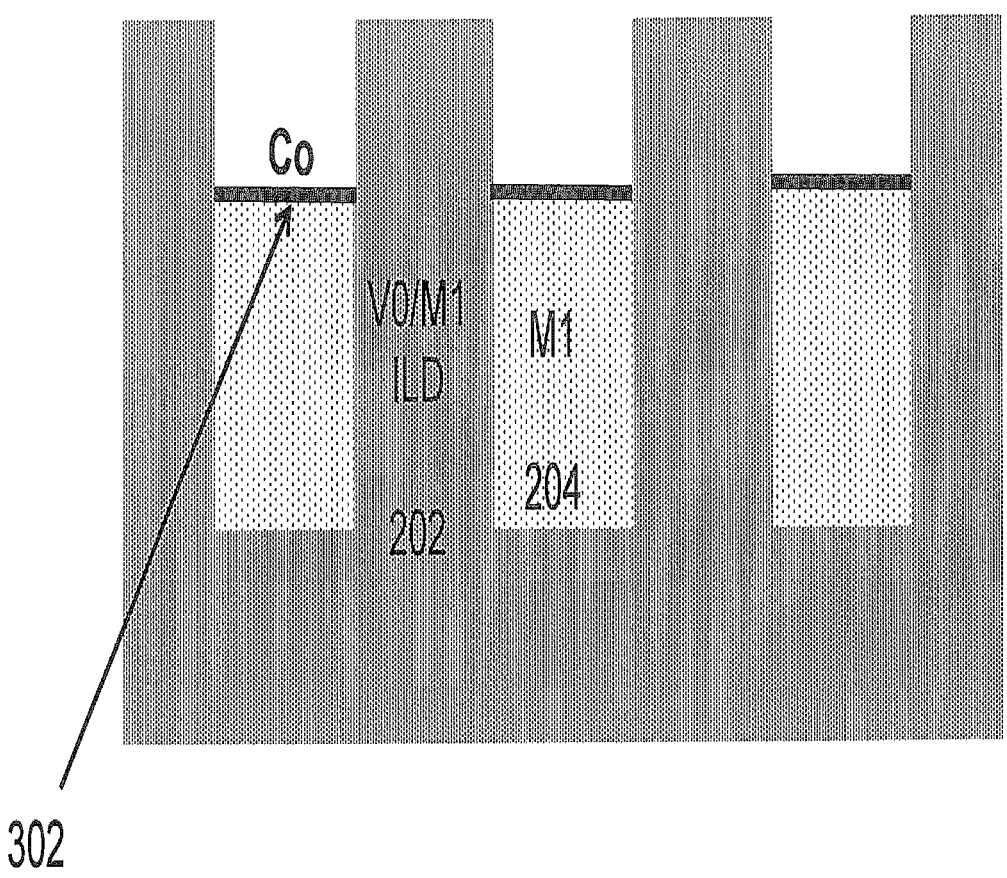

FIG. 6A illustrates operability of the exemplary embodiment.

Figure 6B:
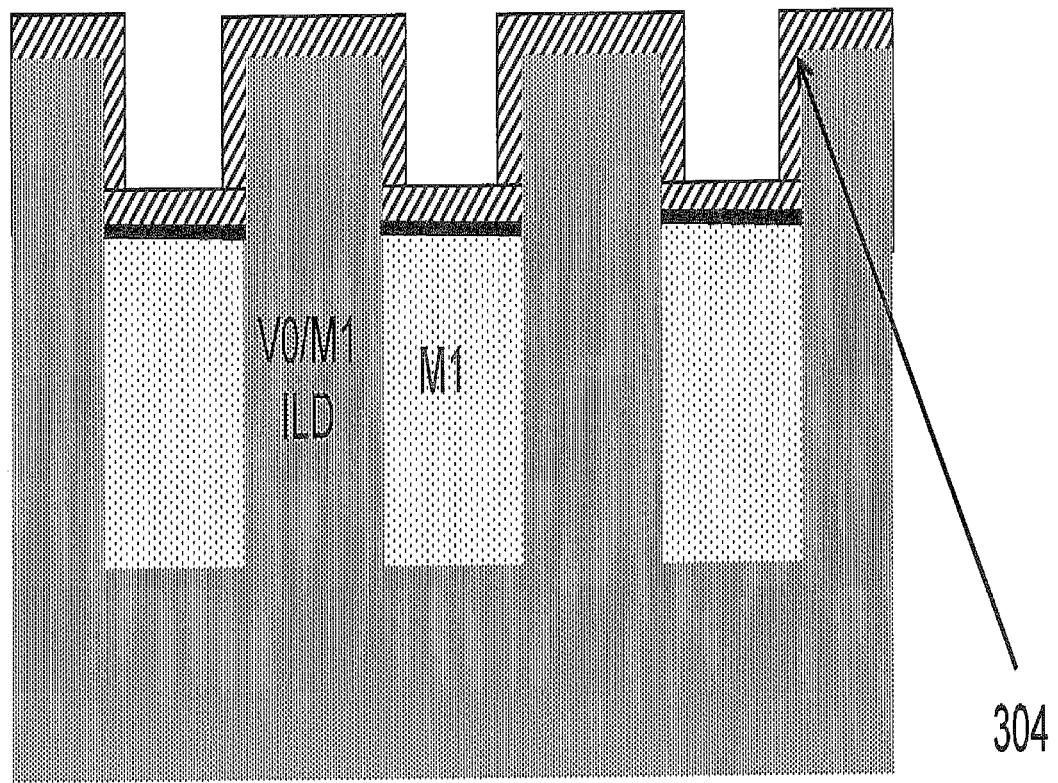
Figure 6C:
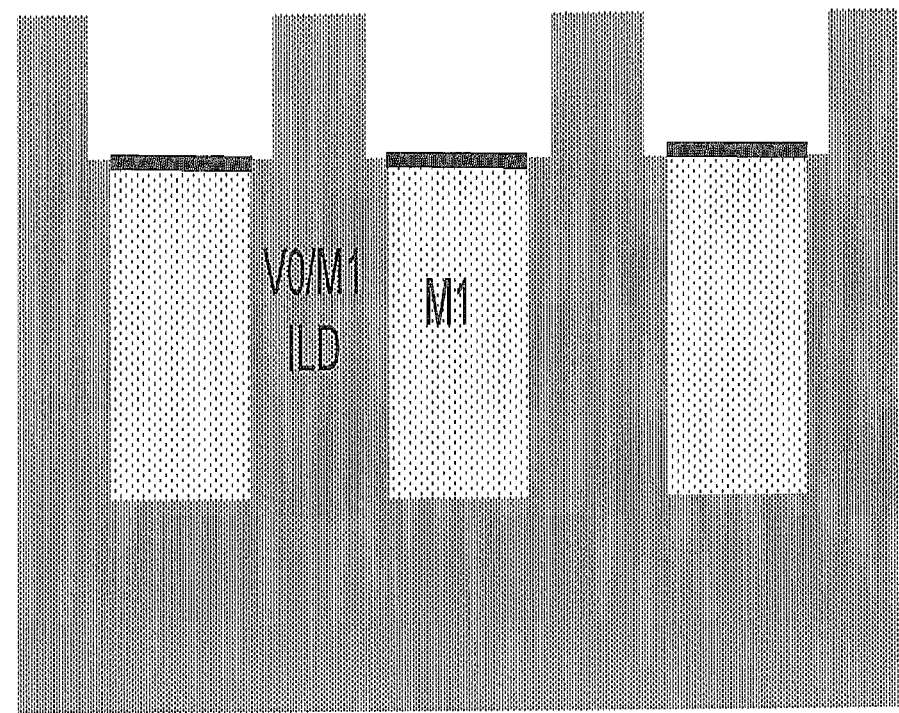

FIG. 6B and FIG. 6C illustrate further operability of the exemplary embodiment.

Figure 7A:
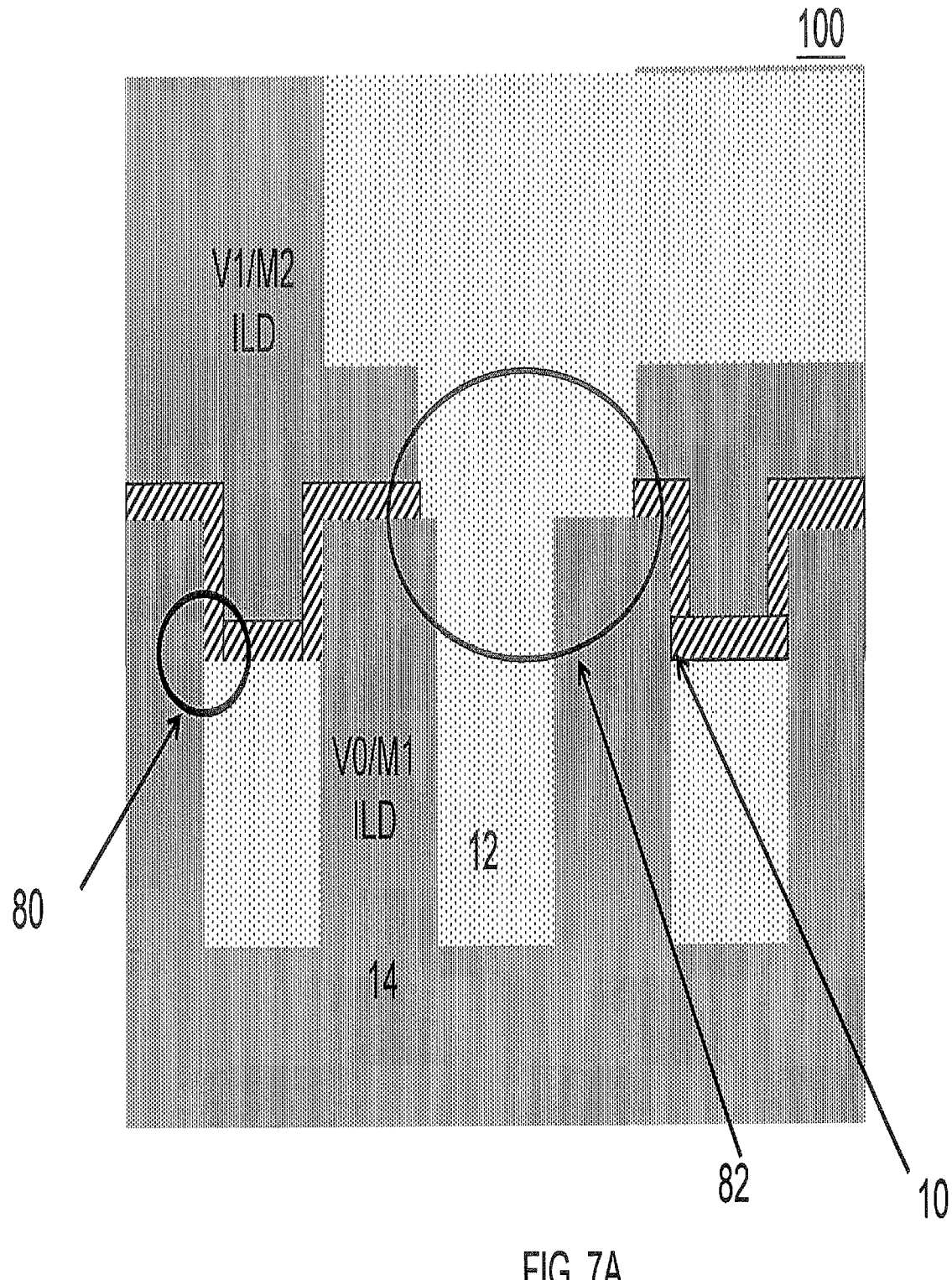

FIG. 7A illustrates a result of the related art for comparison.

Figure 7B:
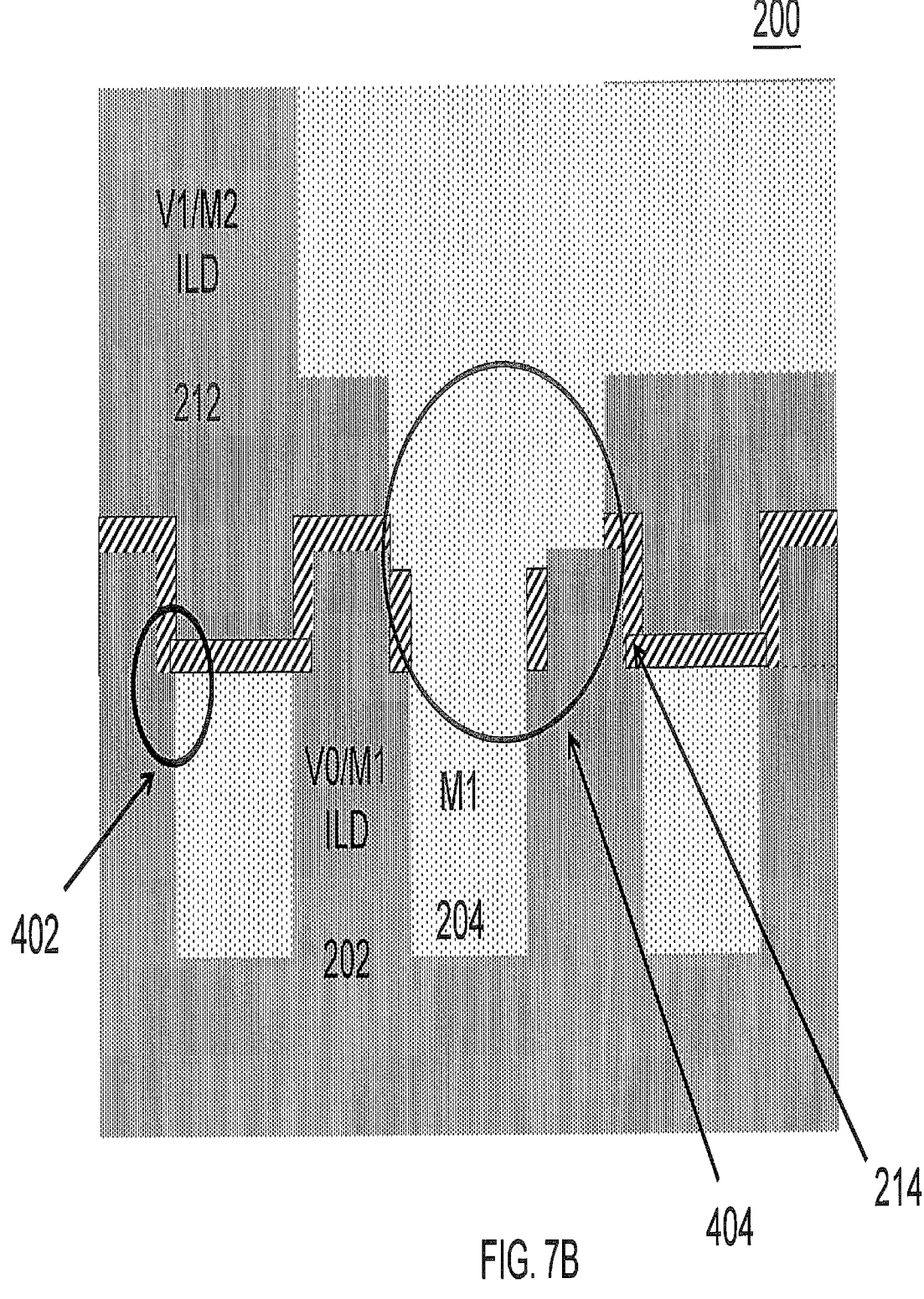

FIG. 7B illustrates the exemplary embodiment for comparison.

Figure 8A:
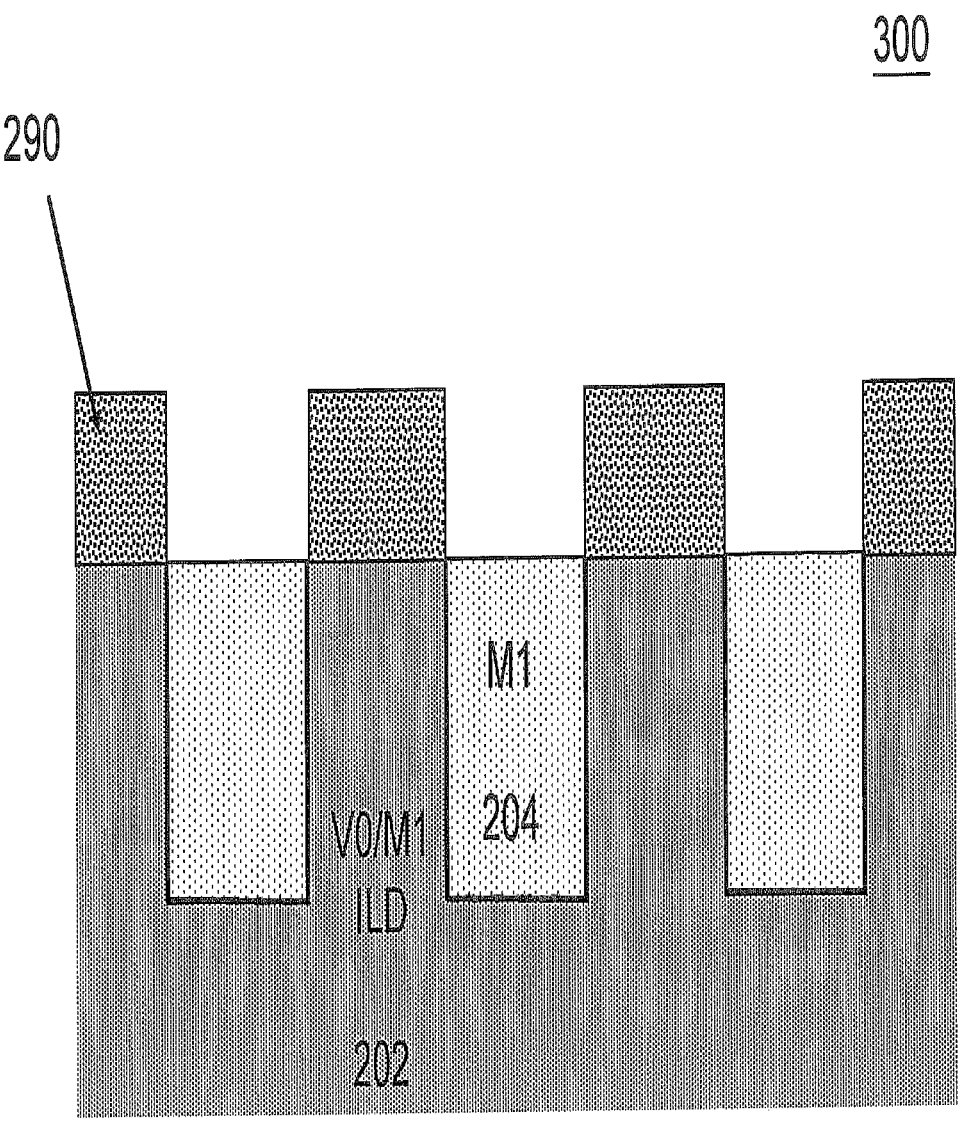

FIG. 8A illustrates another exemplary embodiment showing a growth of a dielectric material.

Figure 8B:
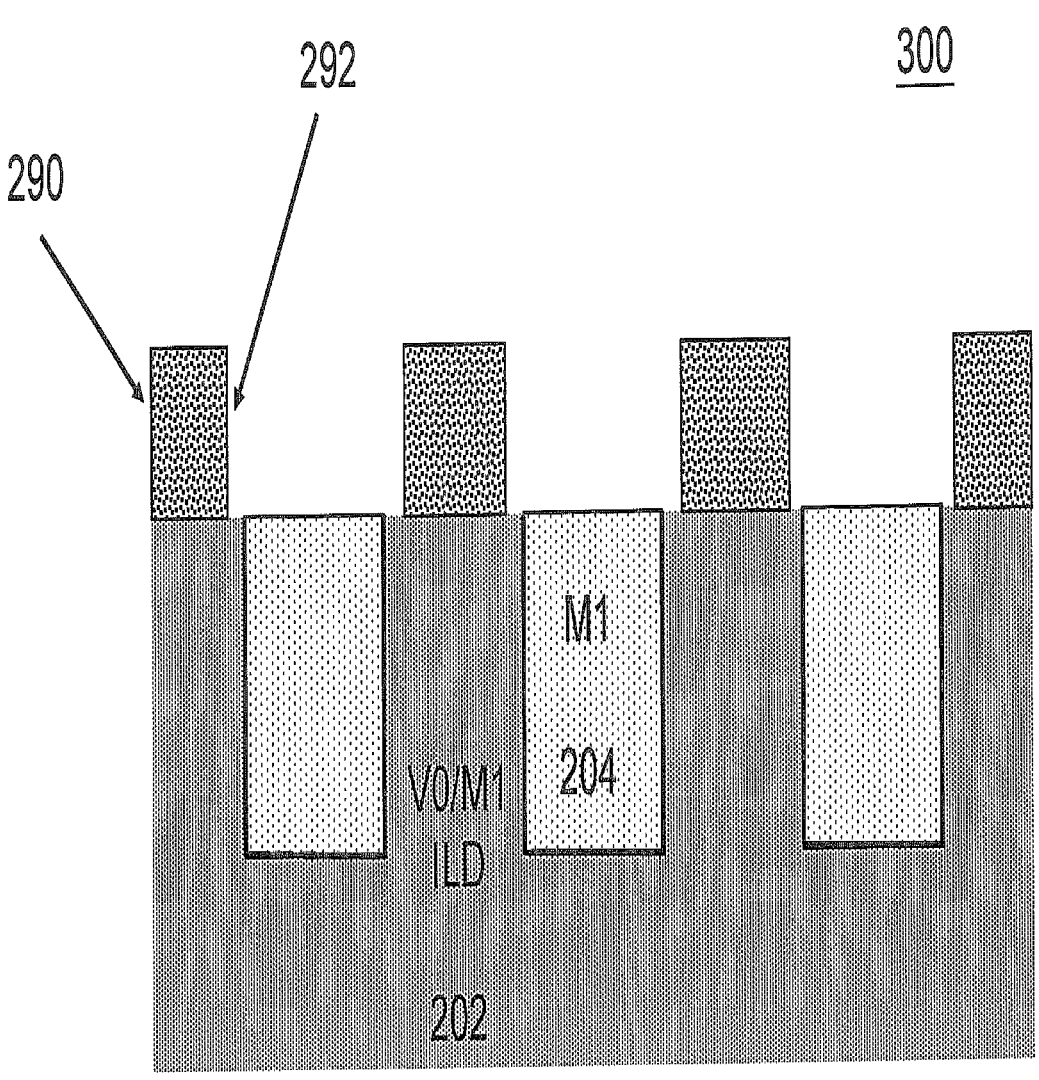

FIG. 8B illustrates the lateral trimming in the other exemplary embodiment.

Figure 8C:
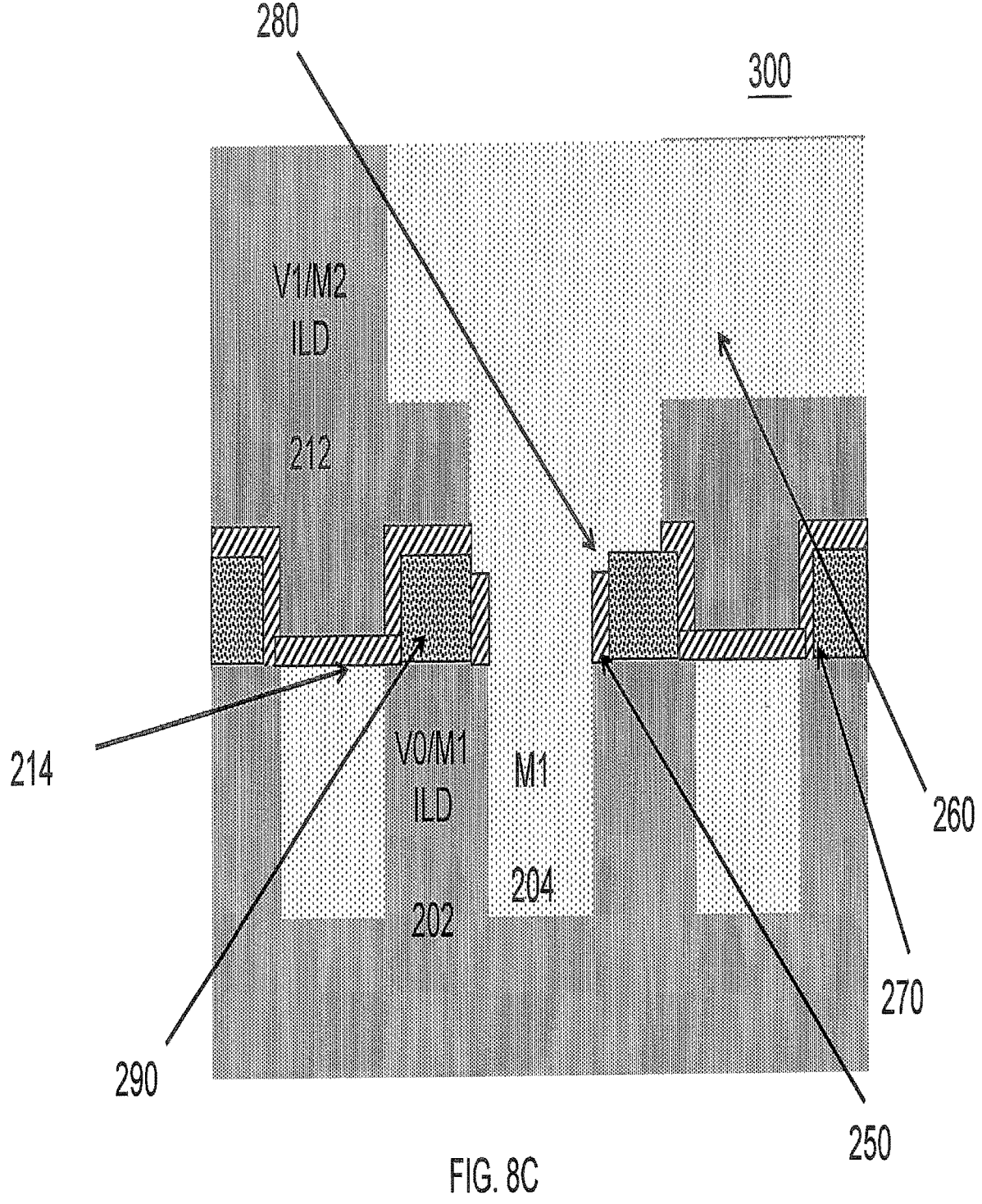

FIG. 8C illustrates a final structure in the other exemplary embodiment.

DETAILED DESCRIPTION OF A PREFERRED EMBODIMENTS

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

As mentioned, fabrication of VLSI requires an interconnect structure including metallic wiring that connects individual devices in the single semiconductor chip. The wiring interconnect network can include certain features that function as electrical conductors. A metal line can go across the chip, and a via can connect lines in different levels. The metal lines and vias can include, for example, copper or other substance and are insulated by the interlayer dielectrics (ILD, also referred to as interlevel dielectric) that function as electrical insulators. The ILD is made of a dielectric material used to electrically separate closely spaced interconnect lines arranged in several levels.

With the chip being massively reduced in size over the years, the interconnect structure has also been reduced accordingly. The via levels are one of the most challenging to print. Additionally, there are overlay errors that result from misalignment during the lithography. The overlay errors may lead to reliability issues.

A failure for interconnects that may be dependent on overlay error of lithographic patterns, are electromigration (EM) and time-dependent dielectric breakdown (TDDB). Electromigration is, for example, a transport of material from a gradual movement of the ions in a conductor due to the momentum transfer between conducting electrons and diffusing metal atoms. Electromigration failure results when a void forms in the metal feature through metal diffusion leading to a short in the circuitry. If the wiring is constructed such that the intersection between the via and line is too small, smaller voids formed by electromigration can lead to failure.

Overlay errors in the related art result in reduced spacing between the via and the metal level below, and therefore increase the dielectric field. As mentioned, there is a need to provide a technique of reducing the spacing variation.

Via contact resistance is a performance-limiting factor for nanofabrication technologies. Dual-damascene fill requires physical vapor deposition liner/barrier deposition displacing primary conductor, a major contributing factor to via resistance. It is difficult to build a self-aligned fine pitch via.

Fully aligned via (FAV) reactive ion etching (RIE is an emerging technology that has many benefits, but has many challenges. Recess of prior metal level or selective dielectric growth of the prior ILD (Interlevel or Interlayer Dielectric) creates the desired structure to enable FAV. However, anisotropically etching of the dielectric barrier cap from the via structure is very challenging and may actually result in the loss of the desired structure that enables FAV.

Isotropic or partially isotropic cap etch is not an option as there are subsequent metallization issues. Undercutting during the process poses serious yield and reliability concerns.

The following provides a technique of forming a fully aligned via that is more efficient and avoids affecting yield and reliability issues such that there is an improvement in process margin and Electromigration resistance.

FIG. 1A through 1D illustrates a FAV RIE of related art where cap etch is performed and pull-down is selective to interlevel dielectric, to ensure full contact area. A dielectric etch selective to the cap is performed in FIG. 1A. The semiconductor structure 100 includes the interlevel dielectric at Via 1/metal level 2 (V1/M2) 16 formed on the cap 10. In addition, there is interlevel dielectric at Via 0/metal level 1 (V0/M1) 14 formed adjacent to first level of metal (M1) 12. The dielectric ILD at V1/M2 16 is etched selectively to the cap 10 as seen in area 18.

Figure 1A:
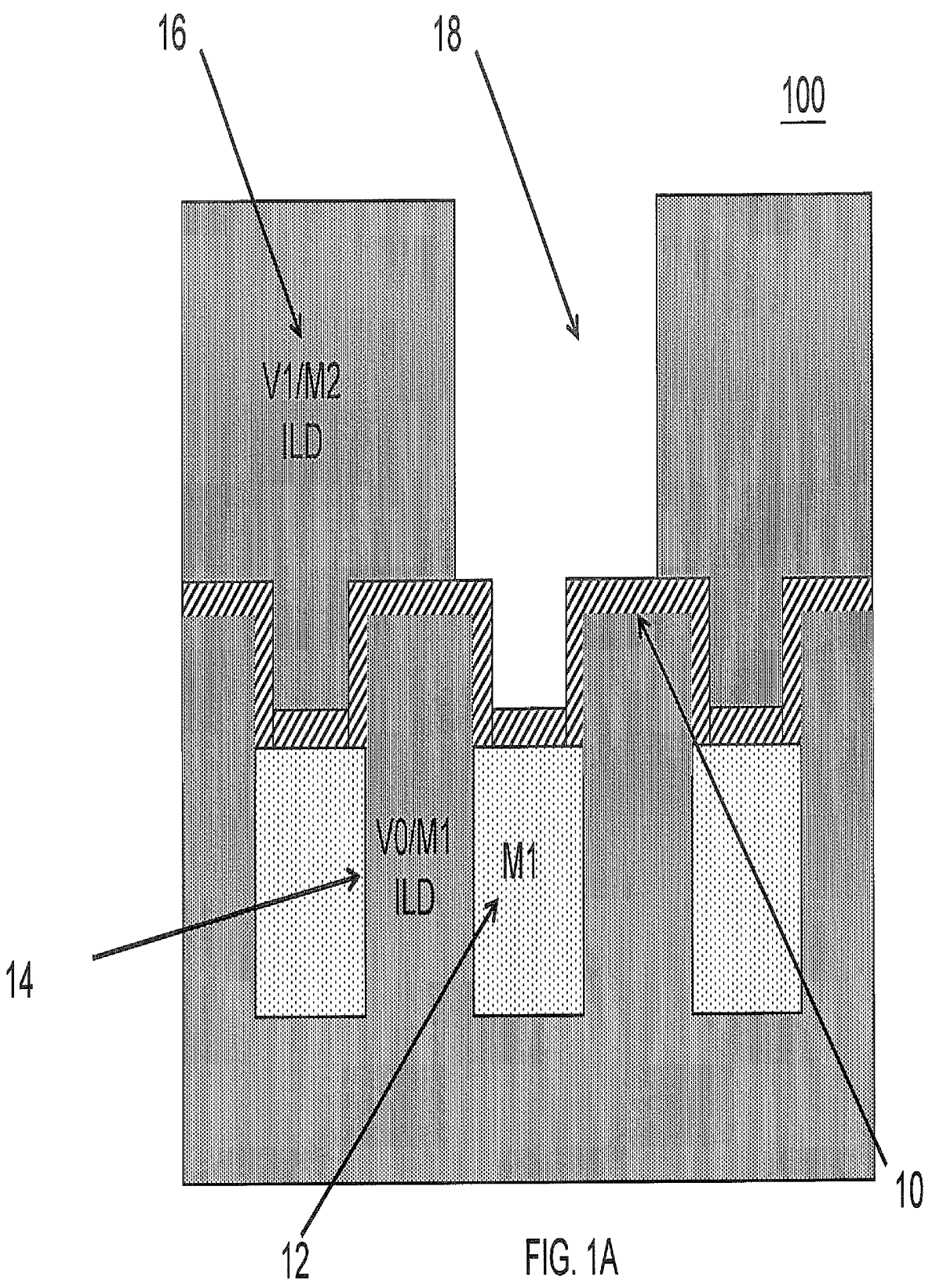
FIG. 1A illustrates a FAV RIE of the related art.
Figure 1B:
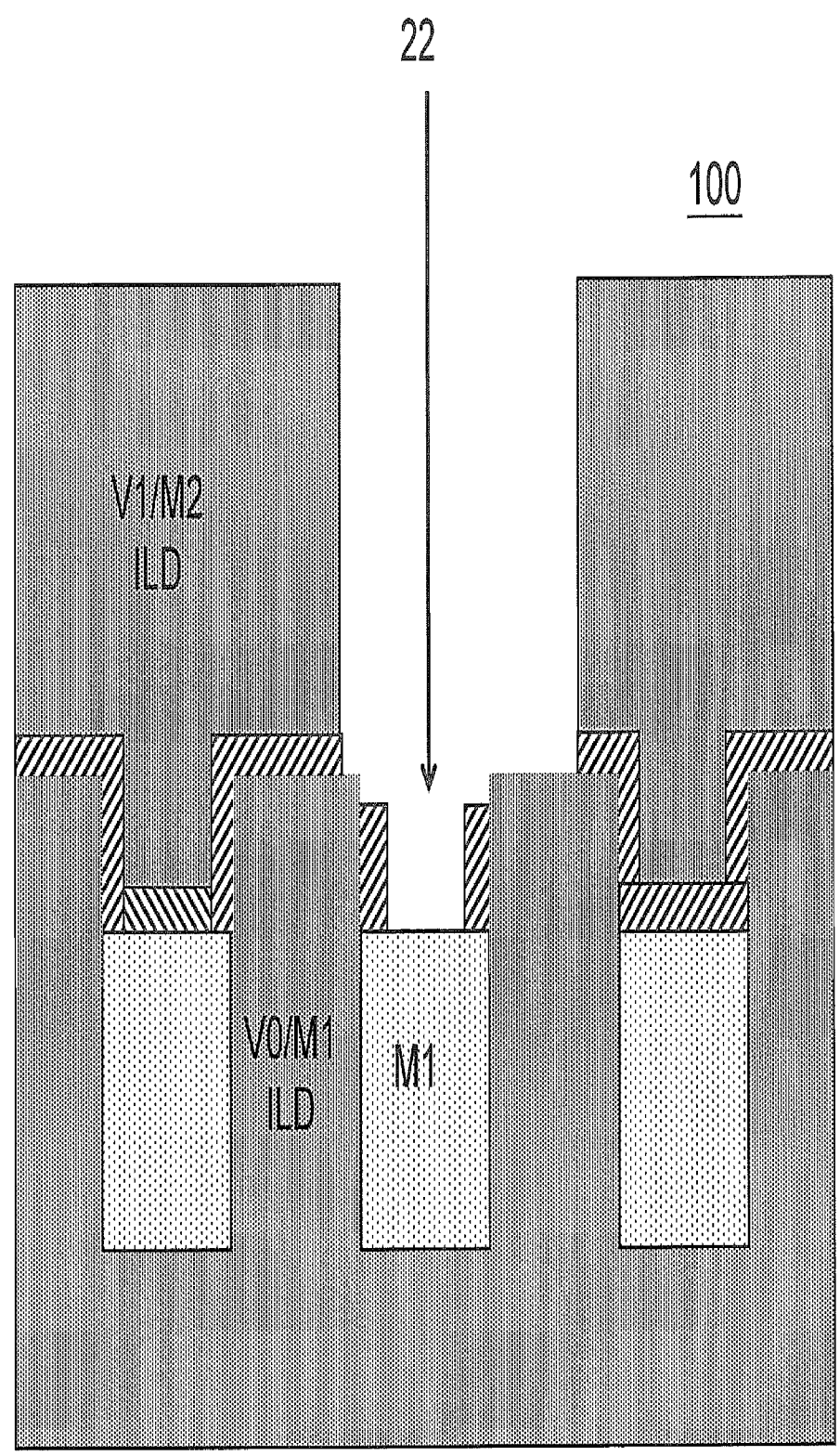
FIG. 1B illustrates a further process of FAV RIE of the related art.

Referring to FIG. 1B, then one drills down a via to the M1 line as seen in point 22. Then the idea is to open up the cap layer as seen at point 22. As seen further in area 24 in FIG. 1C, the Cap layer is further pulled down.

However, the cap etch is challenging and pull down selective to interlevel dielectric to ensure a full contact area. In fact, a full pull down selective to the interlevel dielectric is necessary to ensure a full contact area. Typically there is a direct etch, then form a spacer, and then to pull the spacer. In such an etch sequence, the directional etch first forms a spacer which then has to be pulled down completely.

Figure 1C:
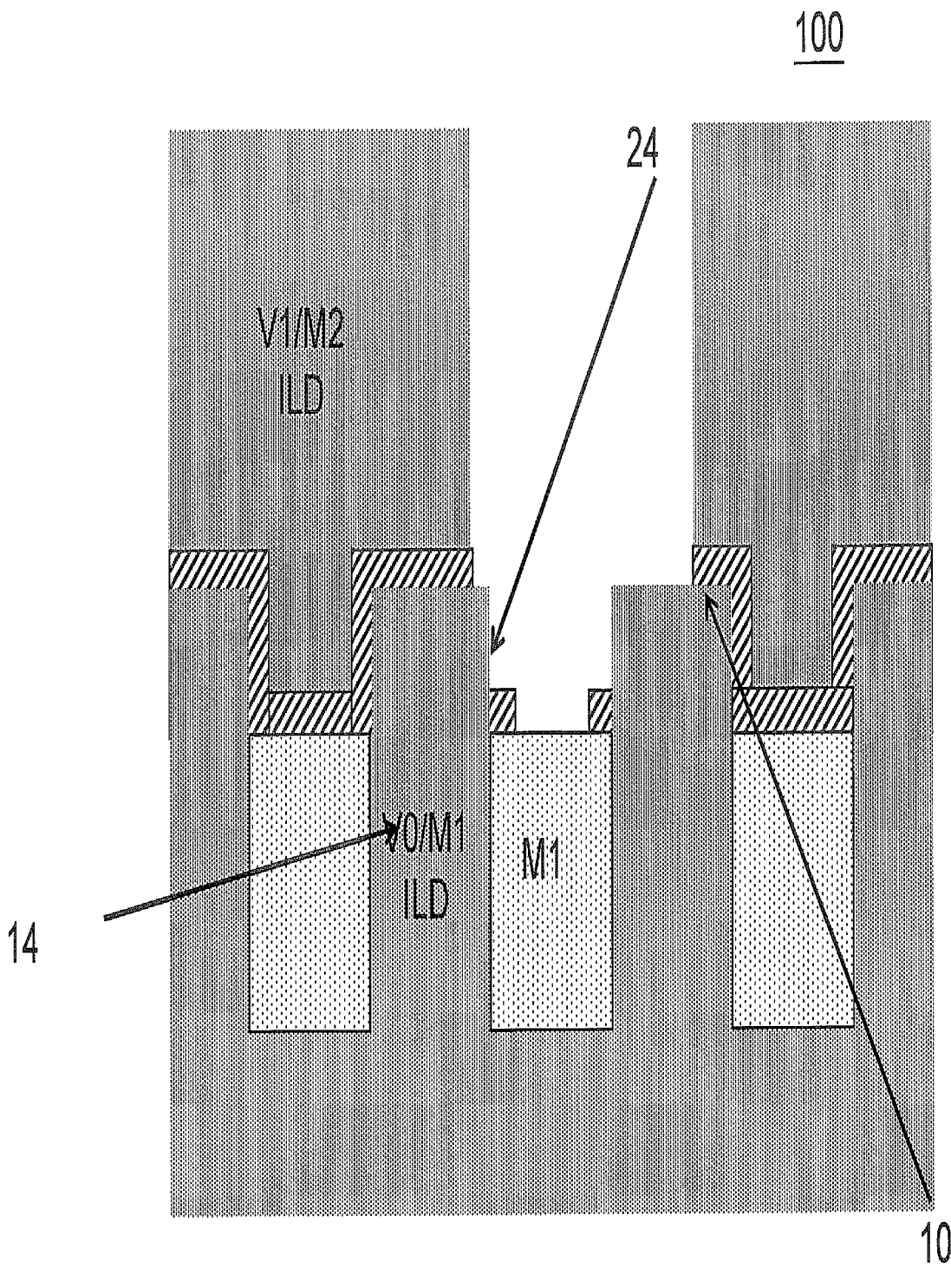
FIG. 1C illustrates a further process of FAV RIE of the related art.
Figure 1D:
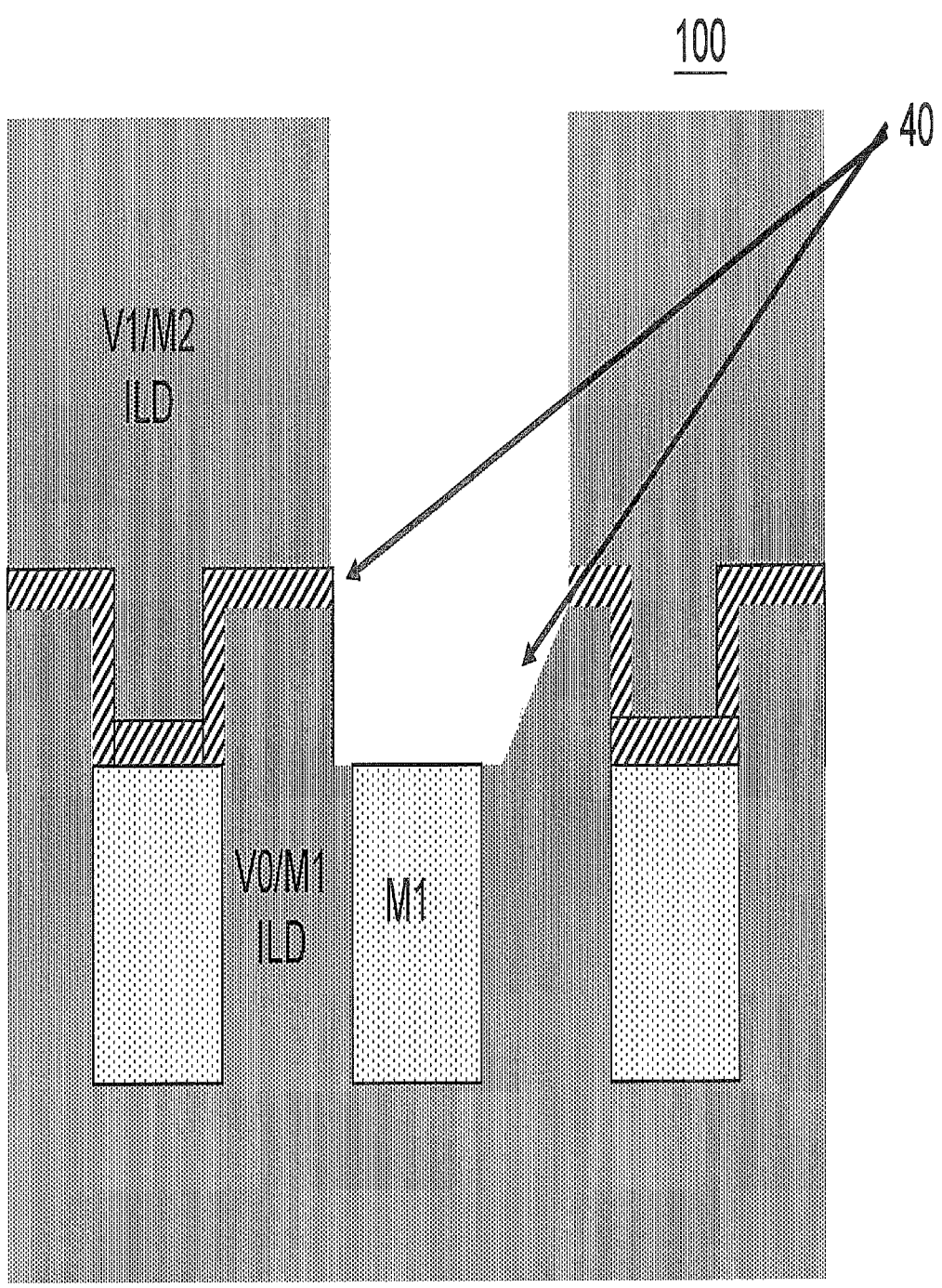
FIG. 1D illustrates a further process of FAV RIE of the related art.

However, during the process as seen in FIG. 1D, the corners suffer damage as shown as the corners are rounded as seen in noted area 40. There is CD (critical dimension) loss above the M1 shape. It is desirable to avoid such problems.

Figure 2:
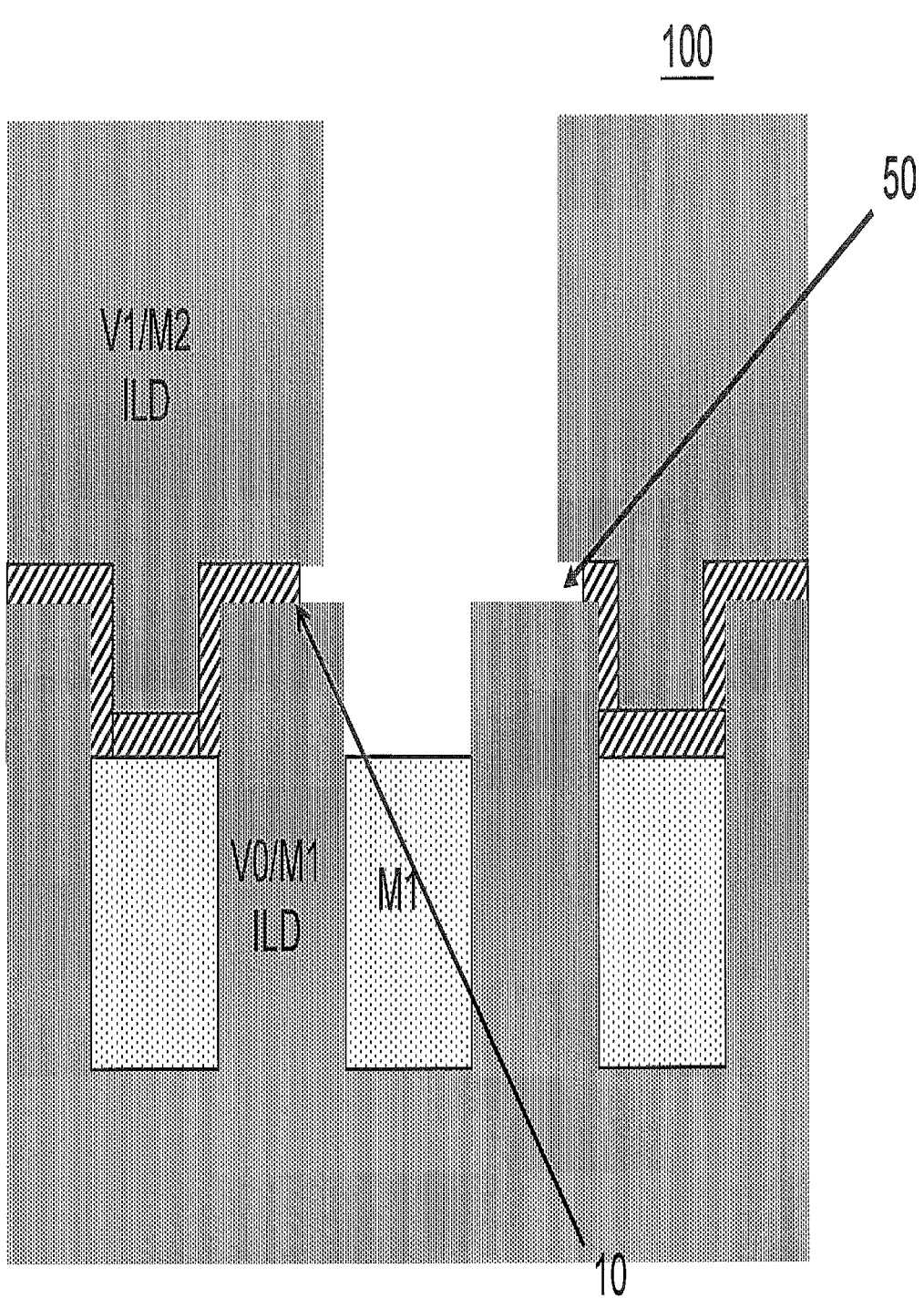
FIG. 2 illustrates another process of FAV RIE of the related art.

FIG. 2 illustrates another process of FAV RIE of related art. From a starting point of FIG. 1A, an isotropic or partially isotropic cap etch is performed in FIG. 2. Therefore, instead of doing a dielectric etch selective to the cap as seen in FIGS. 1B through 1D, instead perform an isotropic etch or partially isotropic etch. This is not an option because of subsequent metallization issues. The cap 10 is removed very quickly, but you also undercut as shown in area 50. As seen from area 50, the undercut poses serious yield and reliability issues.

Figure 3A:
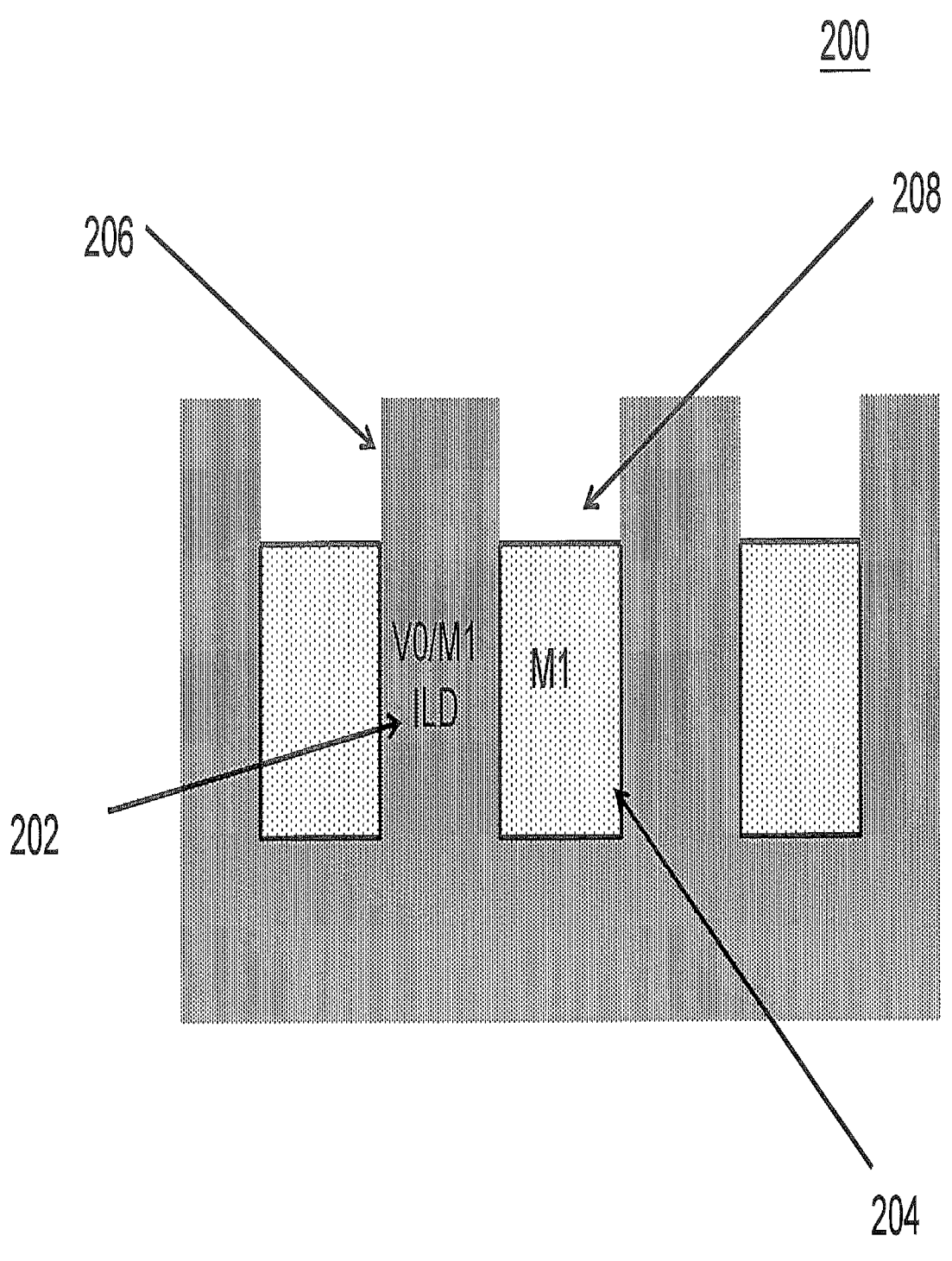
FIG. 3A illustrates a metal recess of FAV RIE in an exemplary embodiment.

FIG. 3A illustrates a metal recess of FAV RIE of an exemplary embodiment. First, one starts with a complete damascene Cu level (after CMP, chemical mechanical polishing) 200. Then the technique includes recessing the prior metal level. There is interlevel dielectric at Via 0/metal level 1 (V0/M1) 202 formed adjacent to first level of metal (M1) 204. The metal layer 204 is recessed as seen in area 208, thereby exposing a top portion 206 of the ILD 202.

Figure 3B:
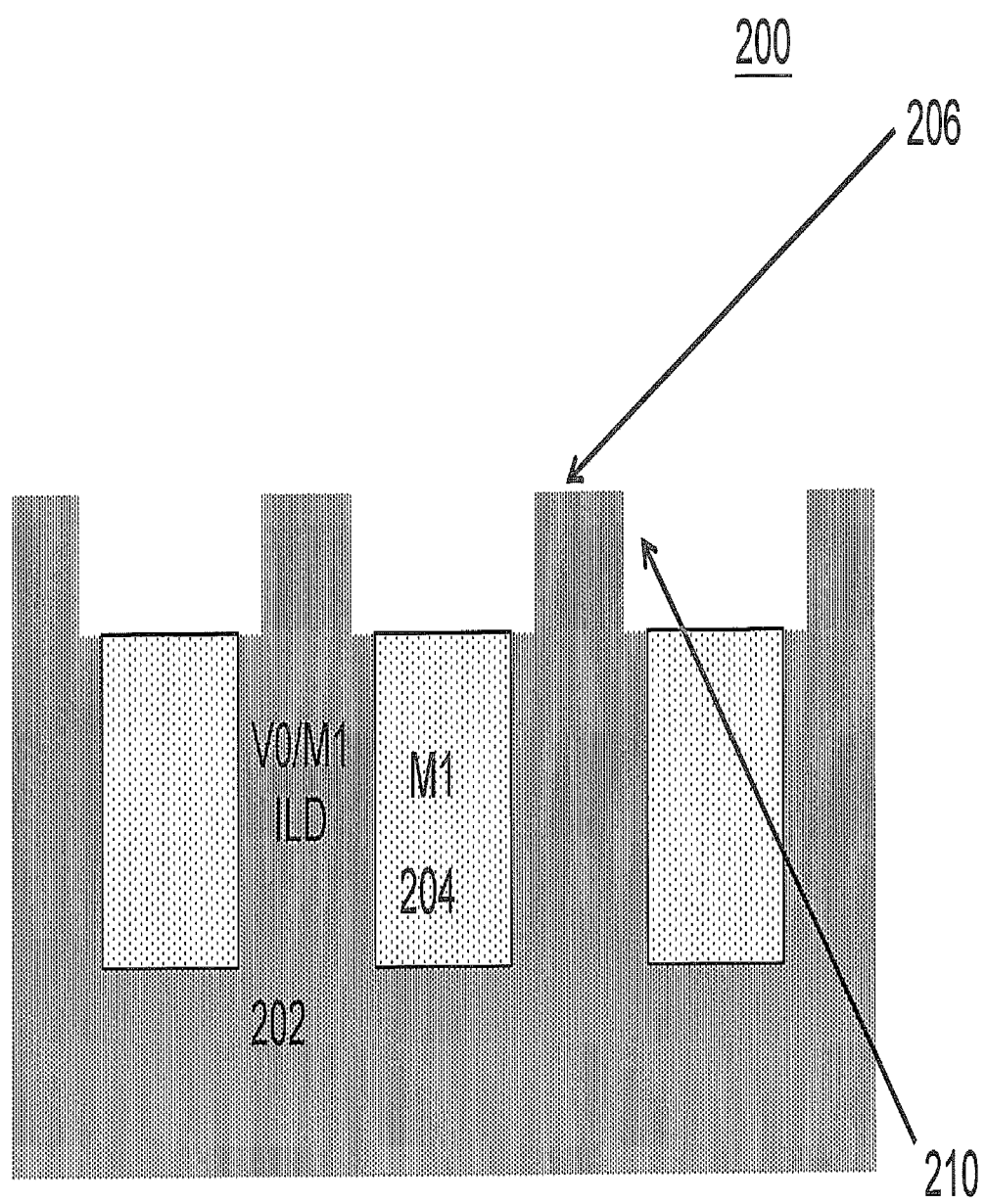
FIG. 3B illustrates a trimming in the exemplary embodiment.

FIG. 3B illustrates a trimming in the exemplary embodiment. As seen in area 210, each of the exposed areas 206 of the ILD 202 at V0/M1 are trimmed laterally. The trimming of the ILD 202 is performed prior to cap deposition, which enables full via opening without pulling down the cap layer. Therefore, first create the metal recess as seen in FIG. 3A, and then do the ILD trim as seen in FIG. 3B. As seen in area 210, the shoulders of the ILD 202 are laterally etched.

Figure 3C:
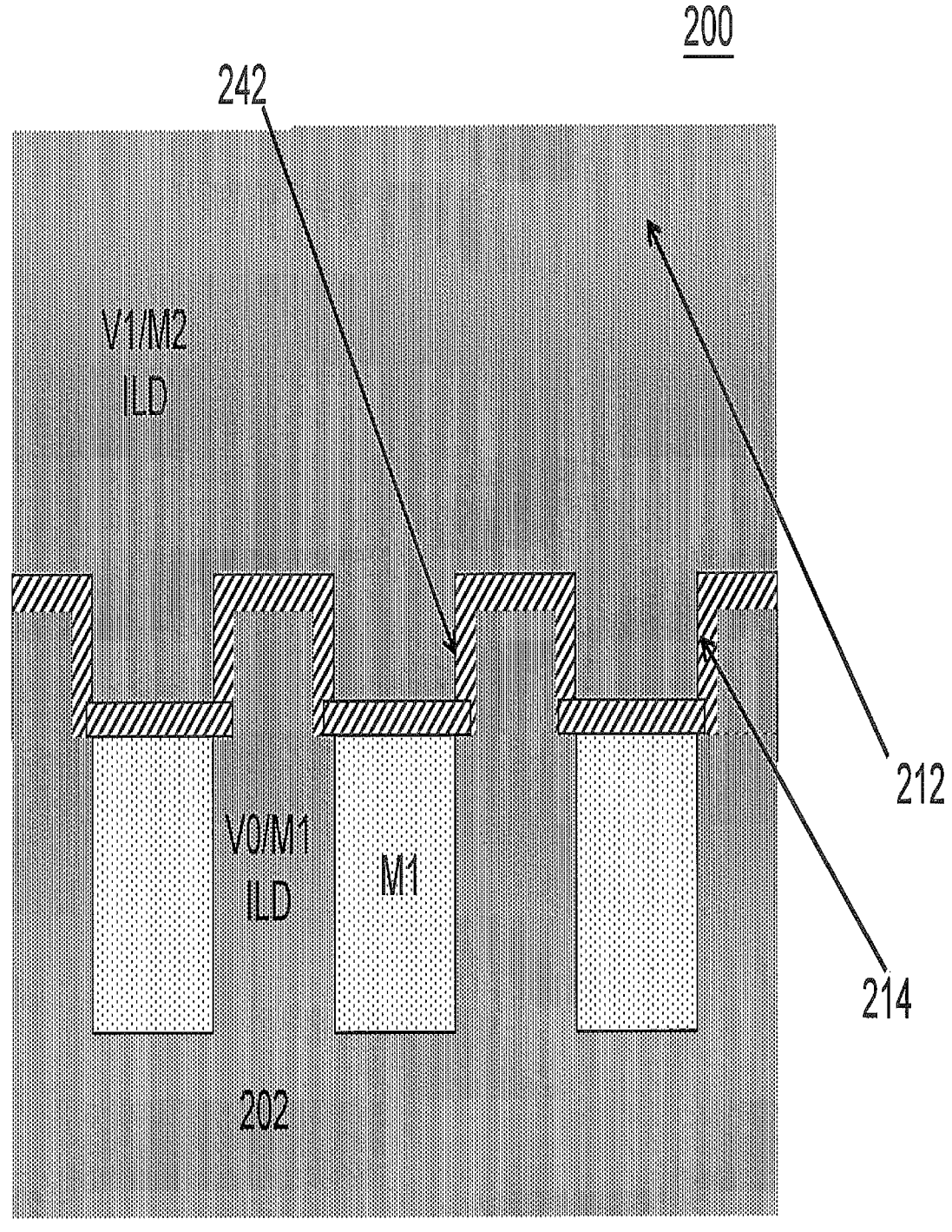
FIG. 3C illustrates a Cap and ILD in the exemplary embodiment.

FIG. 3C illustrates a Cap and ILD in the exemplary embodiment. The cap layer 214 is deposited. One can deposit, if necessary a selective metal cap, and then followed by the dielectric cap. Thereafter, the ILD stack can be deposited for a subsequent metal level as seen in ILD 212 at V1/M2.

Therefore, laterally etch the shoulders 210 of the ILD at V0/M1 202 and then deposit the cap 214 down, and then the ILD layer 212 at V1/M2.

Referring again to FIG. 3C, alternatively, instead of forming a metal recess as seen in FIG. 3A, a dielectric can be selectively grown. Therefore, instead of the metal layer 204 being recessed as seen in area 208, a dielectric is selectively grown. The selective growth of a dielectric material is then laterally trimmed. For example, the dielectric material ILD 202 or a different dielectric material can be selectively grown instead of the metal layer 204 being recessed. Then, the ILD 202 or a different dielectric material at V0/M1 can be laterally trimmed as seen in area 242. Trimming this selective portion would yield similar benefits but a different structure. Such an alternative embodiment is further clarified in FIG. 8 below.

Figure 3D:
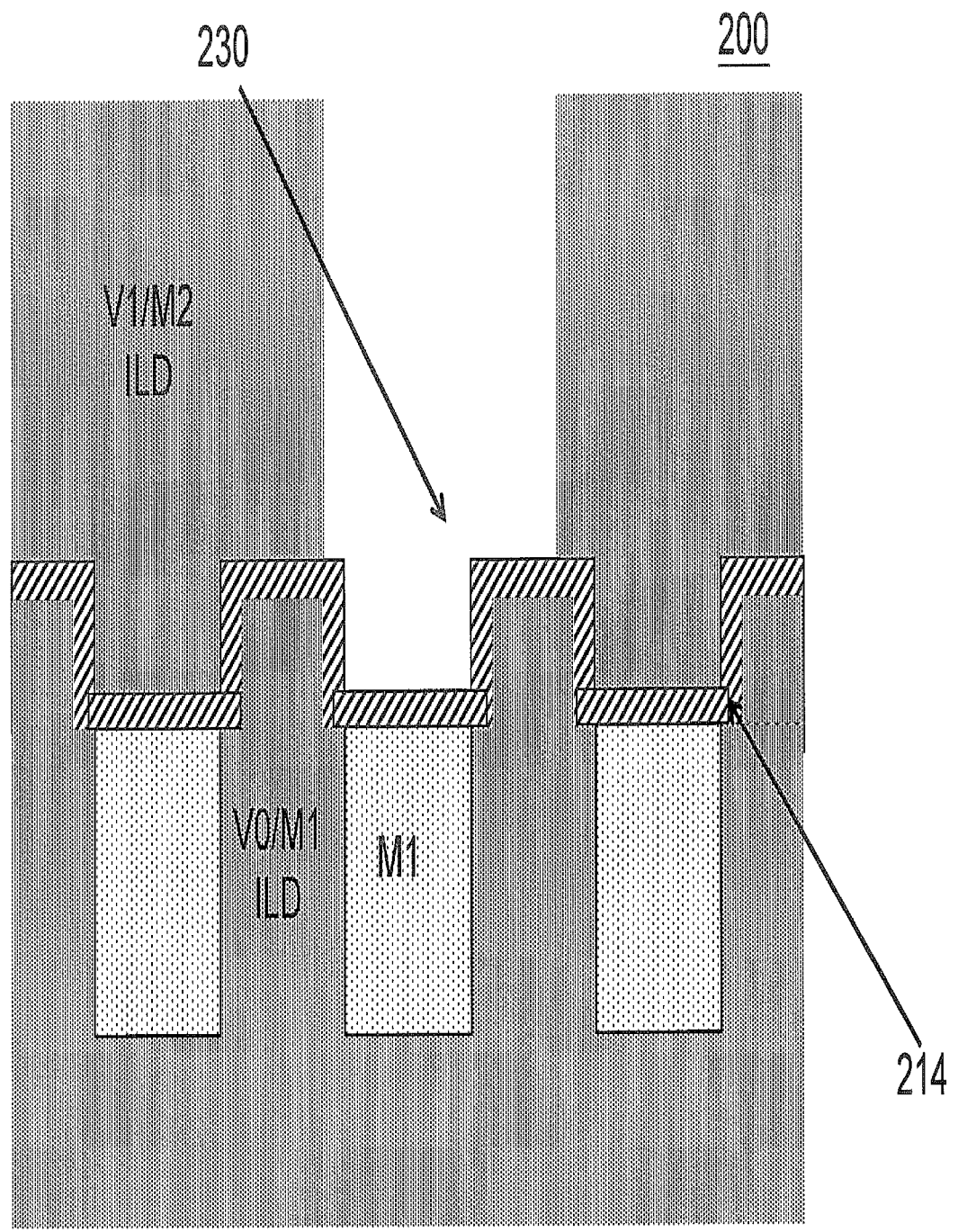
FIG. 3D illustrates a partial via RIE in the exemplary embodiment.

Referring to FIG. 3D illustrates a partial via being formed with RIF (reactive ion etching). As seen in area 230 above the cap area 214, a partial via is formed.

Figure 3E:
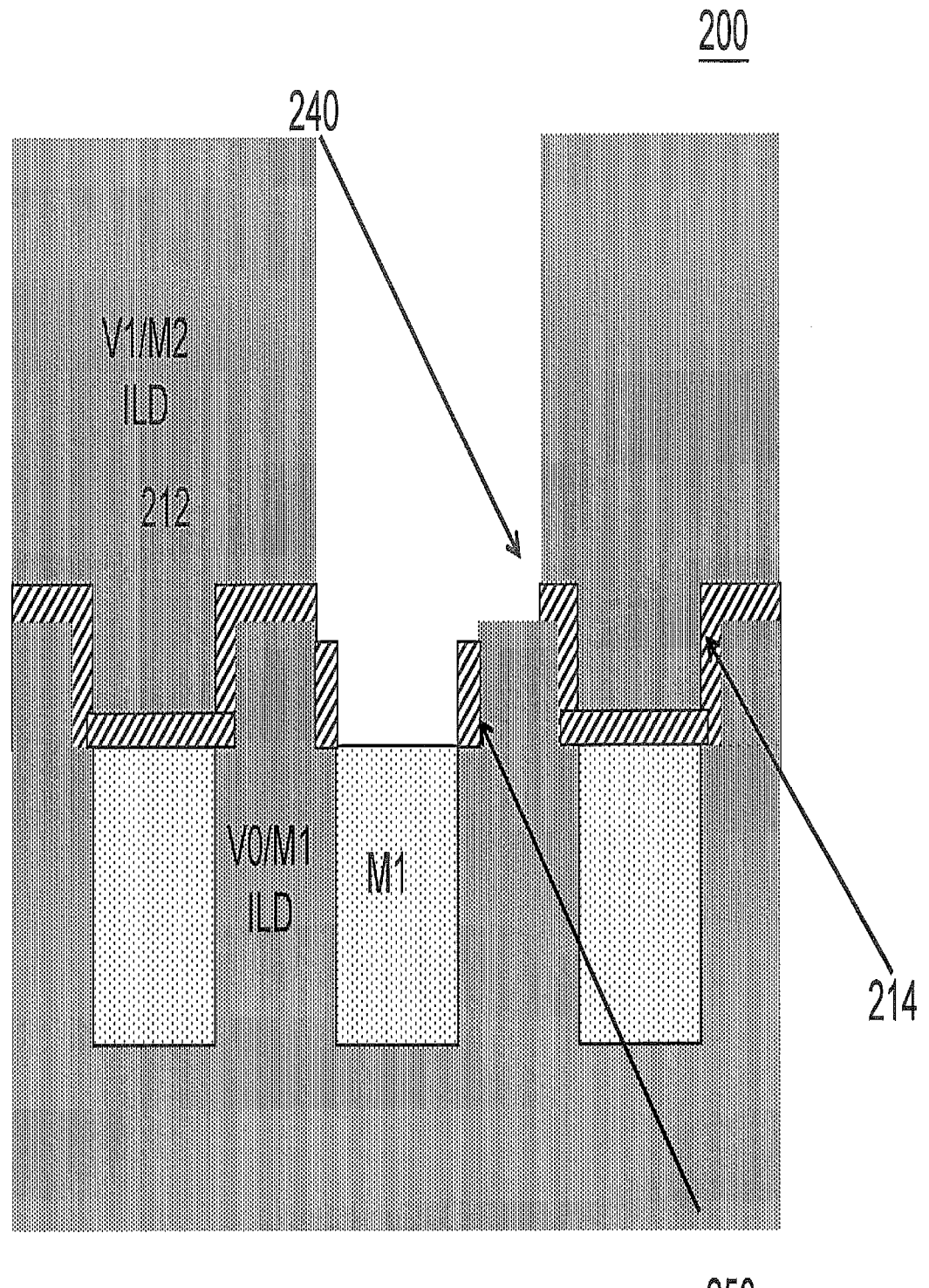
FIG. 3E illustrates a cap etch in the exemplary embodiment.

FIG. 3E illustrates a cap etch in the exemplary embodiment. The cap layer 214 is etched as seen in area 240, but without pulling down the cap layer. Therefore, unlike the related art, one does not need to pull the dielectric cap 214 down. One can just do a short cap open etch and leave the cap on the sidewall as seen in portion 250. The cap 214 is lining the sidewall of the ILD 212. The full opening in this case is still achieved, but without the problems of the related art. Therefore, this also makes the FAV RIE much easier.

Figure 4A:
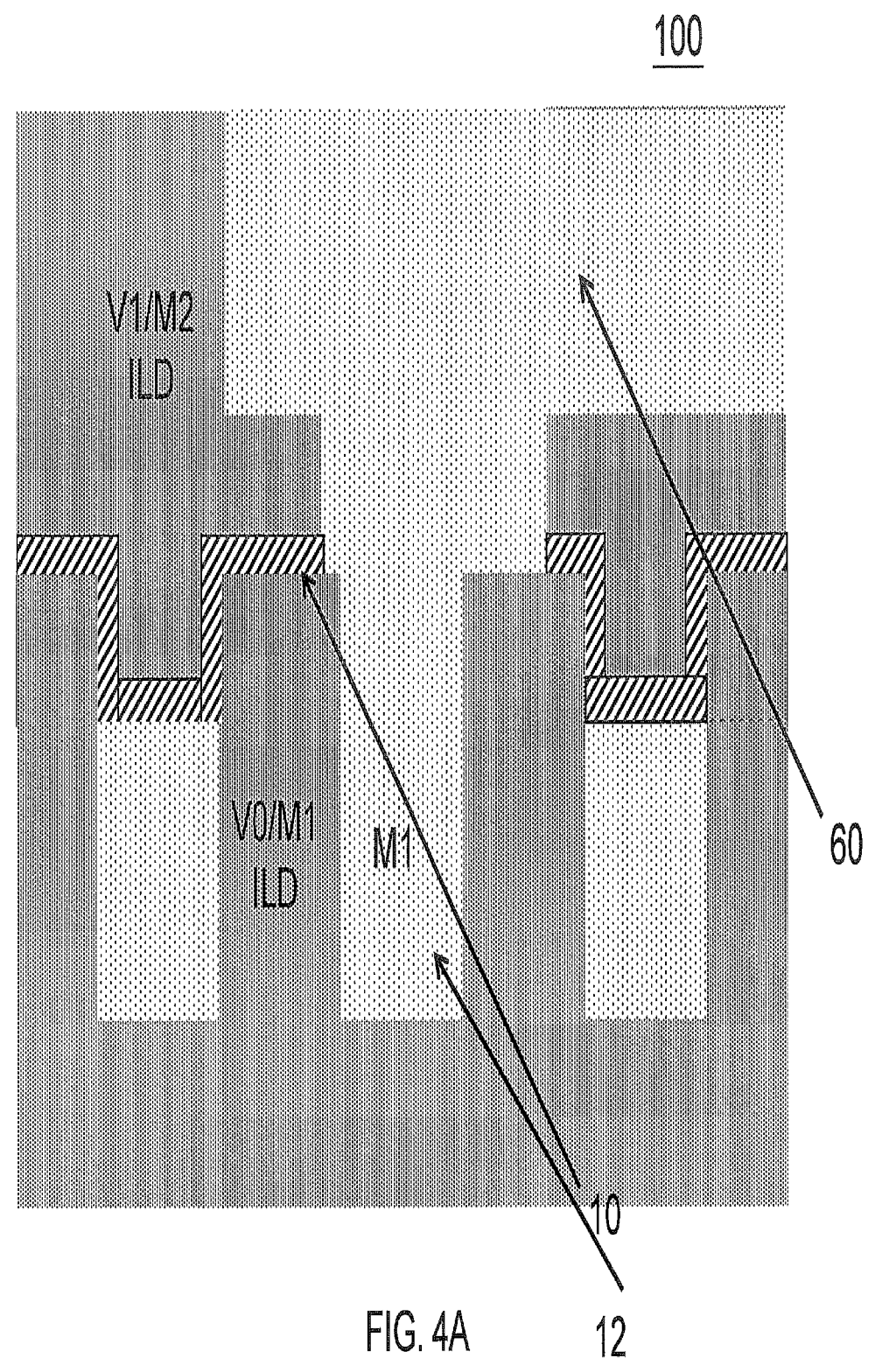

FIG. 4A illustrates a step performed where the corner rounding shown in FIG. 1D does not take place. After the step shown in FIG. 1D, but where the damage of corner rounding does not take place, additional metal layer 60 is deposited to form an extension to the metal layer 12 at M1 in the area where the metal layer 12 was recessed.

Figure 4B:
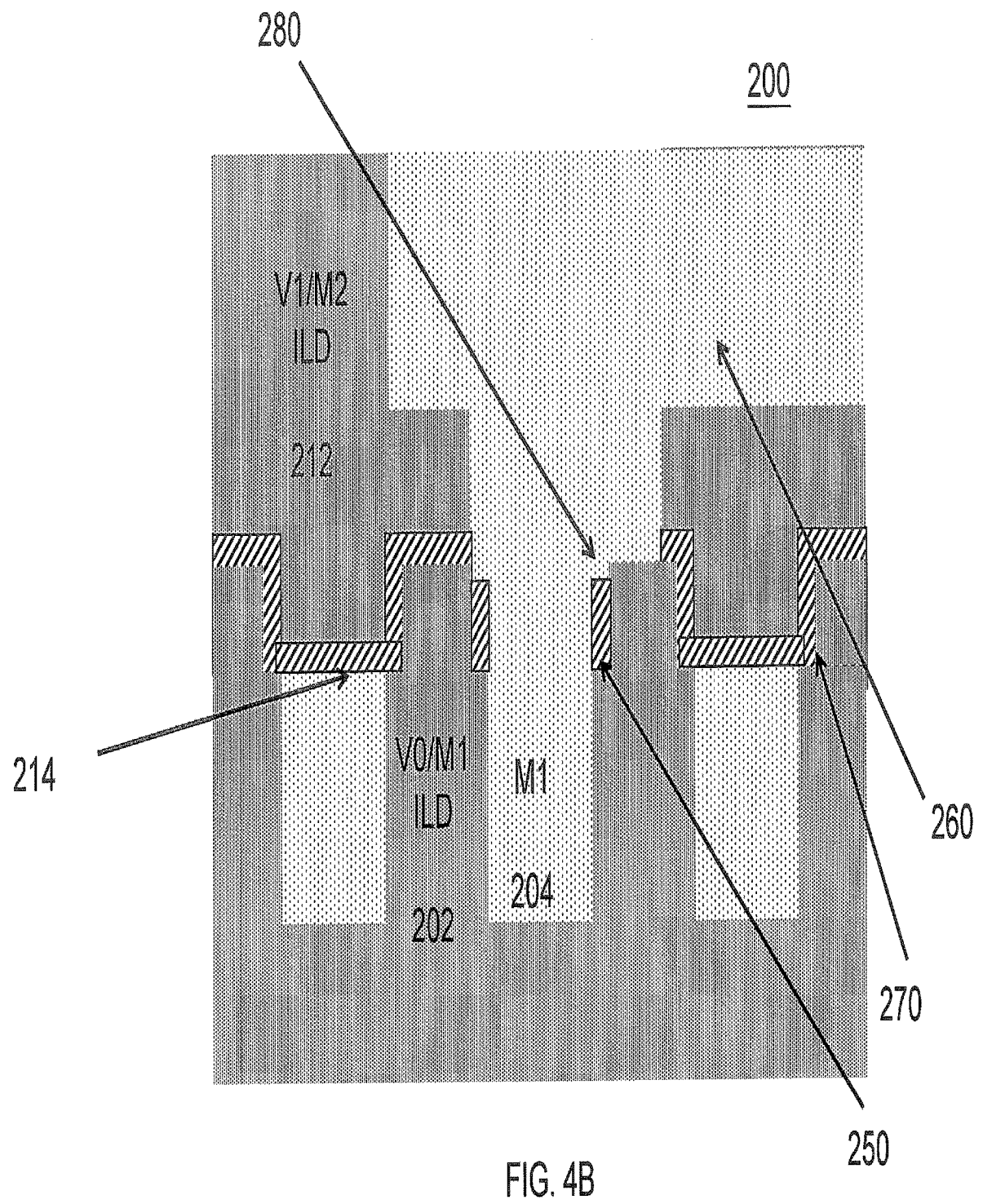
FIG. 4B illustrates the exemplary embodiment for comparison with FIG. 4A.

FIG. 4B illustrates the exemplary embodiment for comparison with FIG. 4A. After the step shown in FIG. 2E of the exemplary embodiment, additional metal layer 260 is deposited to form an extension to the metal layer 204 at M1 in the area where the metal layer 204 was recessed in order to complete the metallization. The cap layer in area 250 lines the via sidewall where the prior metal layer 204 was recessed.

The cap lining 250 results prevents excessive corner rounding of ILD 202 shoulder, which is one of the critical elements for FAV performance. The cap lining 250 does not degrade interconnect performance as a full contact area has been maintained. Additionally, there is better dielectric capping of Metal line corners, which is good for EM (electromigration).

The cap layer 214 overlaps Metal line corners as seen in area 270, thus allowing for more robust Cu passivation and improved Electromigration resistance. The cap layer lining via sidewall 250 is made without sacrificing via contact area and improving FAV performance.

Moreover, it can be seen how the cap layer 214 sits on top of the M1 metal layer 204 as the cap 214 overlaps now. The upper corners of the ILD 202 are tucked under the cap 214 as seen in area 280. On the other hand, the cap 10 sits at the corner in the related art of FIG. 4A. The corner of the ILD 202 in the exemplary embodiment of FIG. 4B is covered much better than the related art.

For electromigration, the fast diffusion path is typically at the top surface and especially at those metal corners if you do not get good coverage or good adhesion, then you may have a fast diffusion path. Therefore, laterally etching the ILD gives a better cap coverage. Laterally pushing those shoulders back so you get better cap coverage is helpful. Once one pulls back the shoulders, then one does not have to directionally pull down all the cap material. There is no need to pull down the cap material in the exemplary embodiment.

Figure 5A:
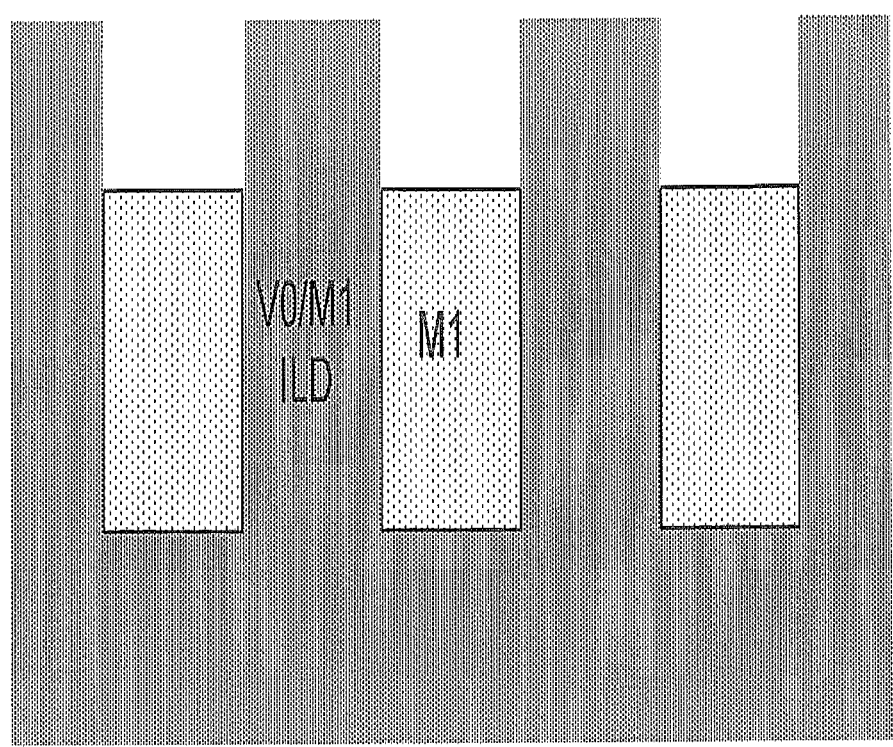
FIG. 5A illustrates the metal recess.

FIG. 5A illustrates the forming of the metal recess which can be made according to know techniques.

Figure 5B:
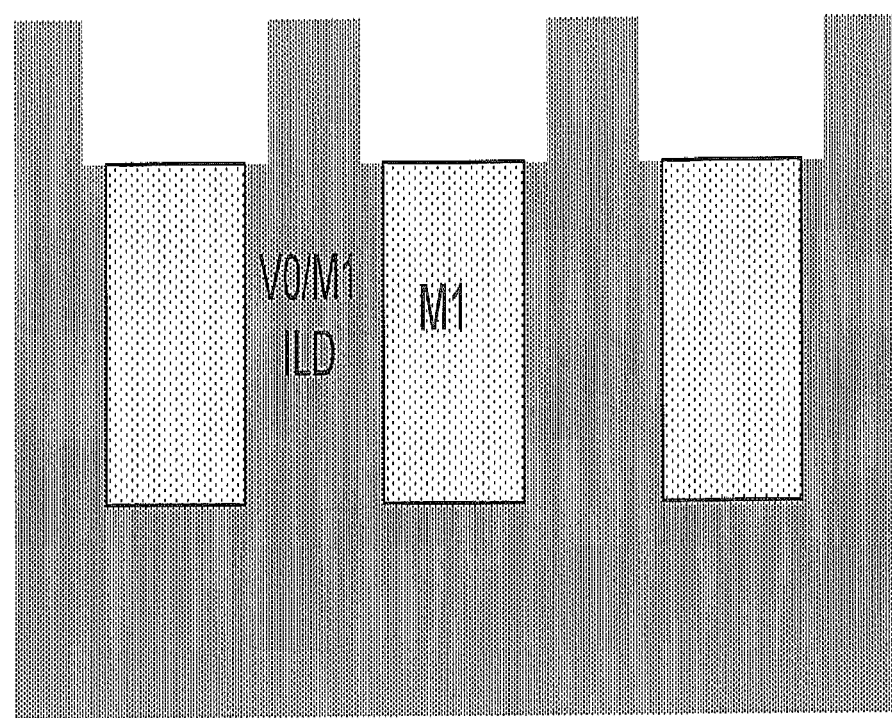
FIG. 5B illustrates the ILD trip of the exemplary embodiment.

FIG. 5B illustrates further the ILD trim of the exemplary embodiment. The ILD trip should be performed prior to the cap deposition. However, there can be some additional options for the trim. One option is to introduce a finite selectivity during the metal recess as seen in FIG. 5A. Another option is to trim ILD after metal recess (and assuming recess had very high selectivity to ILD) with example trims shown in FIGS. 6A through 6C.

FIG. 6A illustrates operability of exemplary embodiment. Example of trim is to perform selective Co cap deposition followed by dielectric film deposition. The Co cap deposition 302 is shown as being deposited on the metal layer M1 204. Therefore, it is shown here to passivate and protect the Cu with Co.

FIG. 6B illustrates further operability of exemplary embodiment. Then damage the ILD 202 with or without the dielectric film. One can pre-clean prior to Co cap deposition and prior to dielectric film, or both to damage ILD 202. The dielectric can be a sacrificial nitride 304, for example.

Referring to FIG. 6C, then gentle DHF (dilute HF) is provided to remove damage (and dielectric film 304).

FIG. 7A illustrates a result of the related art for comparison. FIG. 7B illustrates the final structure in exemplary embodiment. The advantages over the prior art are shown in further detail. One additional step is added from the related art, is that the ILD trim is made prior to cap deposition. This greatly simplifies the FAV RIE sequences, especially the cap open etch. This also improves barrier cap coverage on prior metal lines and improves EM.

In addition, as seen in comparison of FIGS. 7A and 7B, the final structures are different. The circled portion 80 and 402 shows the edges of the cap layer is different. In the related art, there is sharp edge at the point 80 where the metal layer 12 at level M1 cap layer 10, ILD 14 and cap 12 all meet. However, as seen in FIG. 7B, from the lateral trimming, a shoulder for extra support is created as seen in encircled area 402.

Additionally, as seen in encircled area 82, there is no additional support provided by the cap layer 10 around where the metal layer 12 is extended to complete the metallization. However, in encircled area 404, it can be seen the additional lining of the cap layer 214 on the shoulders of the ILD 202. As mentioned above, these structural differences greatly simplify the FAV RIE sequences, especially cap open etch. They also improve barrier cap coverage on prior metal lines and improve EM.

The Cap 214 overlapping line corners as seen in encircles area 402 provides for more robust Cu passivation, and improved EM. The Cap 214 lining via sidewall in encircled area 404 provides a process without sacrificing via contact area and improved FAV performance.

FIGS. 8A through 8C illustrate another exemplary embodiment as referenced in FIGS. 3A through 3C. Therefore, alternatively, instead of forming a metal recess as seen in FIG. 3A, a dielectric can be selectively grown. Therefore, as seen in FIG. 8A, a dielectric is selectively grown via a selective deposition of a dielectric 290. The dielectric 290 can be formed from the dielectric material ILD 202 or a different dielectric material. Then, the selectively deposited dielectric material 290 is then laterally trimmed as seen in area 292 in FIG. 8B. Each of the deposited materials 290 can be laterally trimmed. Trimming this selective portion 292 would yield similar benefits but a different structure than the structure formed in FIG. 3. FIG. 8C illustrates the final semiconductor structure 300.

Additionally, the present invention reduces the worst-case spacing variation significantly which helps to avoid problems of the related where overlay errors result in reduced spacing between the via and the metal level below, and therefore increasing the dielectric field.

The many features and advantages of the invention are apparent from the detailed specification, and thus, it is intended by the appended claims to cover all such features and advantages of the invention that fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor device, comprising:
   a lower interconnect level comprising a first interlevel dielectric, ILD, and a plurality of parallel lower metal lines in an upper portion of the first ILD;
   an upper interconnect level comprising a second ILD and an upper metal line in an upper portion of the second ILD;
   a self-aligned via connecting the upper metal line to a first lower metal line, wherein:
      the first ILD comprises a first ILD region disposed between the first lower metal line and an adjacent second lower metal line;
      the second ILD comprises a second ILD region disposed on the first ILD region;
      the first ILD region comprises a first material and the second ILD region comprises a second material different than the first material;
      the first material is disposed adjacent to an interface between the first ILD region and the second ILD region and the second material is disposed adjacent to the same interface;
      the second ILD region comprises opposing vertically-oriented sidewalls self-aligned to opposing vertically-oriented sidewalls of the first ILD region therebelow and separated by a distance less than a distance separating opposing vertically-oriented sidewalls of the first ILD region; and
      the self-aligned via contacts the second ILD region.

2. The semiconductor device of claim 1, wherein the self-aligned via is wider at its interface with the upper metal line than at its interface with the first lower metal line.

3. The semiconductor device of claim 1, wherein a vertically-oriented sidewall of an upper portion of the self-aligned via is disposed over the second ILD region.

4. The semiconductor device of claim 1, wherein:
   a lower portion of the self-aligned via is disposed between opposing portions of a liner, and one of the opposing portions of the liner is disposed on one of the vertically-oriented sidewalls of the second ILD region.

5. The semiconductor device of claim 4, wherein the lower portion of the self-aligned via fully contacts an entire width of the lower metal line.

6. The semiconductor device of claim 1, wherein the self-aligned via contacts one of the vertically-oriented sidewalls of the second ILD region.

7. The semiconductor device of claim 1, wherein an upper surface of the first ILD region is substantially co-planar with an upper surface of the first lower metal line.

8. The semiconductor device of claim 1, wherein the distance between the vertically-oriented sidewalls of the second ILD region is defined directly above the interface.

9. The semiconductor device of claim 1, wherein the distance between the vertically-oriented sidewalls of the first ILD region is defined directly below the interface.

10. The semiconductor device of claim 1, wherein:
   the distance between the vertically-oriented sidewalls of the second ILD region is defined directly above the interface; and
   the distance between the vertically-oriented sidewalls of the first ILD region is defined directly below the interface.

11. The semiconductor device of claim 1, wherein a liner is disposed on portions of the vertically-oriented sidewalls of the second ILD region.

12. The semiconductor device of claim 11, wherein a lower portion of the self-aligned via fully contacts an entire width of the lower metal line.

13. The semiconductor device of claim 11, wherein:
   a lower portion of the self-aligned via is disposed between opposing portions of the liner; and
   one of the opposing portions of the liner is disposed on one of the vertically-oriented sidewalls of the second ILD region.

14. The semiconductor device of claim 13, wherein the lower portion of the self-aligned via fully contacts an entire width of the lower metal line.

15. The semiconductor device of claim 11, wherein the liner comprises nitride.

16. The semiconductor device of claim 1, wherein the self-aligned via contacts a substantially horizontal portion of the second ILD region.

17. The semiconductor device of claim 16, wherein:
   the second ILD region is disposed on a first side of the self-aligned via; and
   the self-aligned via further contacts a substantially horizontal portion of another second ILD region disposed on a second side of the self-aligned via opposite to the first side.

18. The semiconductor device of claim 1, wherein the plurality of parallel lower metal lines comprise Cu.

19. The semiconductor device of claim 1, wherein the self-aligned via comprises Cu.

20. The semiconductor device of claim 1, wherein the upper metal line comprises Cu.

* * * * *